(12) United States Patent
Huang (10) Patent No.: US 8,412,131 B2
(45) Date of Patent: Apr. 2, 2013

(54) DOWN CONVERSION FILTER AND COMMUNICATION RECEIVING APPARATUS

(75) Inventor: Ming-Feng Huang, Jhubei (TW)

(73) Assignee: Industrial Technology Research Institute (TW)

( * ) Notice: Subject to any disclaimer, the term of this patent is extended or adjusted under 35 U.S.C. 154(b) by 549 days.

(21) Appl. No.: 12/421,918

(22) Filed: Apr. 10, 2009

(65) Prior Publication Data
US 2010/0130146 A1 May 27, 2010

(30) Foreign Application Priority Data
Nov. 26, 2008 (TW) .............................. 97145668 A (51) Int. Cl.
*H04B 1/26* (2006.01)
(52) U.S. Cl. .................. 455/107; 327/554; 333/173
(58) Field of Classification Search .................. 327/554; 333/173, 165, 166; 455/306, 307
See application file for complete search history.

(56) References Cited

U.S. PATENT DOCUMENTS

| | | | |
|---|---|---|---|
| 6,480,311 B1 | 11/2002 | Okuda et al. | |
| 6,963,732 B2 * | 11/2005 | Muhammad et al. | 455/131 |
| 7,006,813 B2 | 2/2006 | Staszewski et al. | |
| 7,079,826 B2 | 7/2006 | Muhammad et al. | |
| 7,295,826 B1 * | 11/2007 | Cook et al. | 455/323 |
| 7,535,288 B2 * | 5/2009 | Iida | 327/554 |
| 7,904,048 B2 * | 3/2011 | Lee et al. | 455/307 |
| 7,965,135 B2 * | 6/2011 | Yoshizawa et al. | 327/554 |
| 7,979,047 B2 * | 7/2011 | Miyano et al. | 455/334 |
| 7,982,534 B2 * | 7/2011 | Huang | 327/554 |
| 2005/0176396 A1 * | 8/2005 | Miyagi | 455/313 |
| 2007/0280297 A1 * | 12/2007 | Nakatani et al. | 370/487 |
| 2009/0021296 A1 * | 1/2009 | Miyano et al. | 327/553 |
| 2009/0161801 A1 * | 6/2009 | Huang et al. | 375/344 |
| 2009/0215421 A1 * | 8/2009 | Lim et al. | 455/313 |
| 2009/0270061 A1 * | 10/2009 | Hosokawa et al. | 455/323 |
| 2009/0322418 A1 * | 12/2009 | Burke | 327/552 |
| 2010/0066465 A1 * | 3/2010 | Huang | 333/173 |
| 2010/0093302 A1 * | 4/2010 | Abe et al. | 455/325 |
| 2011/0176640 A1 * | 7/2011 | Morishita et al. | 375/318 |
| 2011/0183639 A1 * | 7/2011 | Morishita | 455/269 |
| 2011/0291750 A1 * | 12/2011 | Huang | 327/554 |

(Continued)

FOREIGN PATENT DOCUMENTS
WO  WO 2008/108090  * 3/2008

OTHER PUBLICATIONS

Daruis Jakonis et al., "A 2.4-GHz RF sampling receiver front-end in 0.18-um CMOS," IEEE Journal of Solid-State Circuits, vol. 40, pp. 1265-1277, Jun. 2005.

(Continued)

*Primary Examiner* — Thomas J Hiltunen
(74) *Attorney, Agent, or Firm* — Lowe Hauptman Ham & Berner, LLP (57) ABSTRACT

A down-conversion filter is provided, using first and second input terminals to receive signals that are differentially outputted by a preceding circuit, and using an output terminal to output a down-converted and filtered signal. An output capacitor is coupled to the output terminal. A first switched-capacitor network is arranged between the first input terminal and the output terminal. A second switched-capacitor network is arranged between the second input terminal and the output terminal. Each switched-capacitor network has capacitors, charging switches and charge-summing switches. The charging switches are designed to alternatively couple the capacitors to the first (or second) input terminal. The charge-summing switches are designed to couple the capacitors to the output terminal.

16 Claims, 11 Drawing Sheets

OTHER PUBLICATIONS

Office Action from corresponding application No. Taiwan 097145668.

Office Action from corresponding Chinese Application No. 200810183771.3.

* cited by examiner

DOWN CONVERSION FILTER AND COMMUNICATION RECEIVING APPARATUS

CROSS REFERENCE TO RELATED APPLICATIONS

This Application claims priority of Taiwan Patent Application No 097145668. filed on Nov. 26, 2008, the entirety of which is incorporated by reference herein.

BACKGROUND OF THE INVENTION

1. Field of the Invention

The present invention relates to down conversion filters.

2. Description of the Related Art

Conventional down conversion filters are designed to filter noise in a stop band. However, because conventional down conversion filters provide the received signal and noise with the same frequency response, noise in the pass band usually remains with the transmitted signals. Thus, conventional down conversion filters have a difficult time filtering noise in the pass band.

BRIEF SUMMARY OF THE INVENTION

The invention discloses down conversion filters comprising a first and a second input terminal, an output terminal, output capacitor, and a first and a second switched-capacitor network. The first and second input terminals are coupled to differential output terminals of a preceding circuit. The output capacitor is coupled to the output terminal of the down conversion filter. The first switched-capacitor network is coupled between the first input terminal and the output terminal. The second switched-capacitor network is coupled between the second input terminal and the output terminal. Each of the aforementioned switched-capacitor networks comprises a plurality of capacitors, a plurality of charging switches, and a plurality of charge-summing switches. The charging switches control the charging of the capacitors by coupling the capacitors to the first (or second) input terminal. To transfer the charges from the capacitors to the output capacitor, the charge-summing switches are designed to couple the capacitors to the output terminal.

The down conversion filter may further comprise a plurality of discharging switches for discharging the capacitors of the switched-capacitor networks.

The down conversion filters may be applied in communication receivers to receive differential output signals from a mixer of the communication receiver. With the down conversion filters of the invention, the communication receiver decreases common-mode noise.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1:
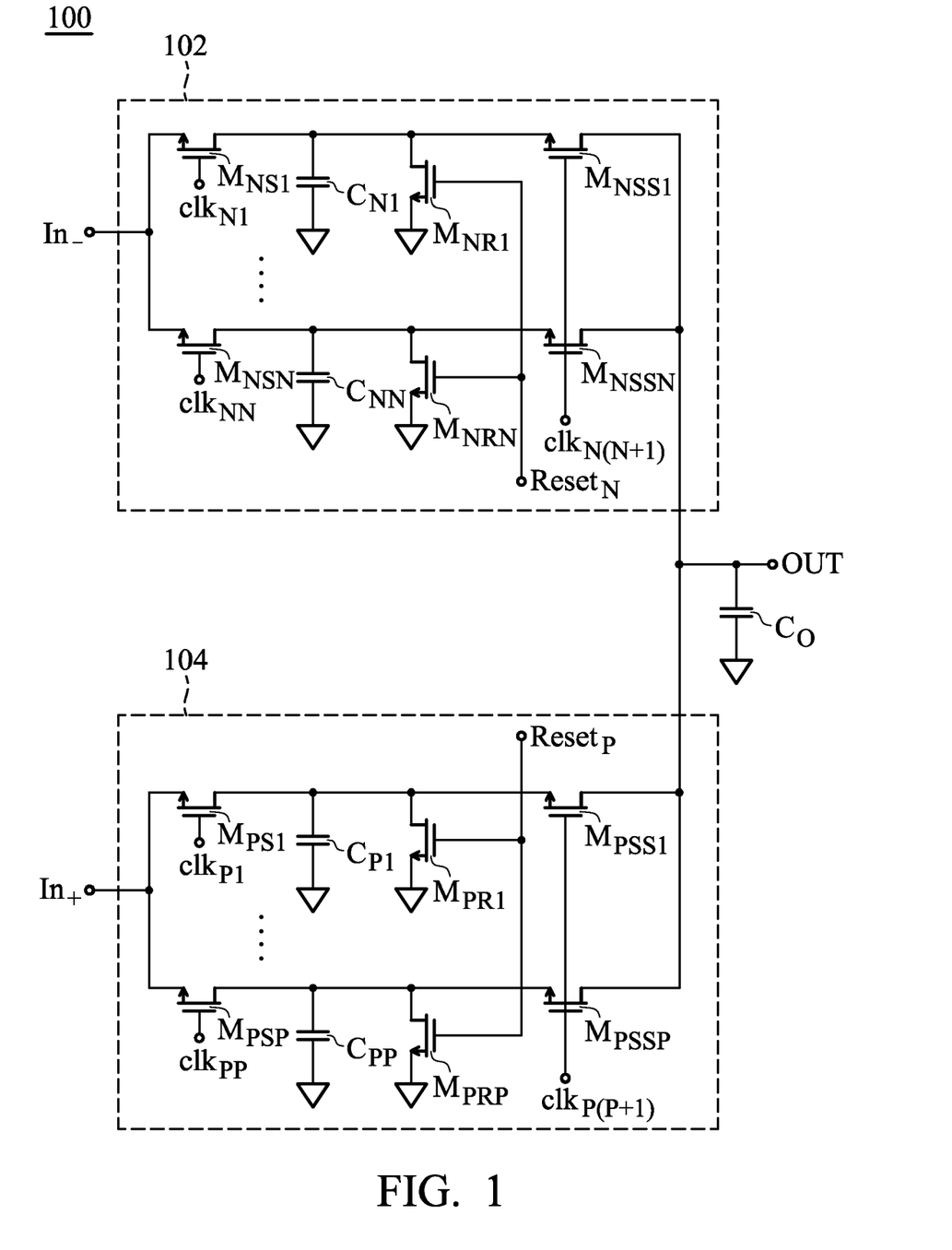
FIG. 1 depicts an exemplary embodiment of down conversion filters of the invention.

FIG. 1 depicts an exemplary embodiment of down conversion filters of the invention. The down conversion filter 100 has two input terminals receiving a first input signal $In_-$ and a second input signal $In_+$, respectively, and has an output terminal OUT.

The down conversion filter 100 comprises a first switched-capacitor network 102, a second switched-capacitor network 104 and an output capacitor $C_o$. The output capacitor $C_o$ is coupled to the output terminal OUT.

Figure 2:
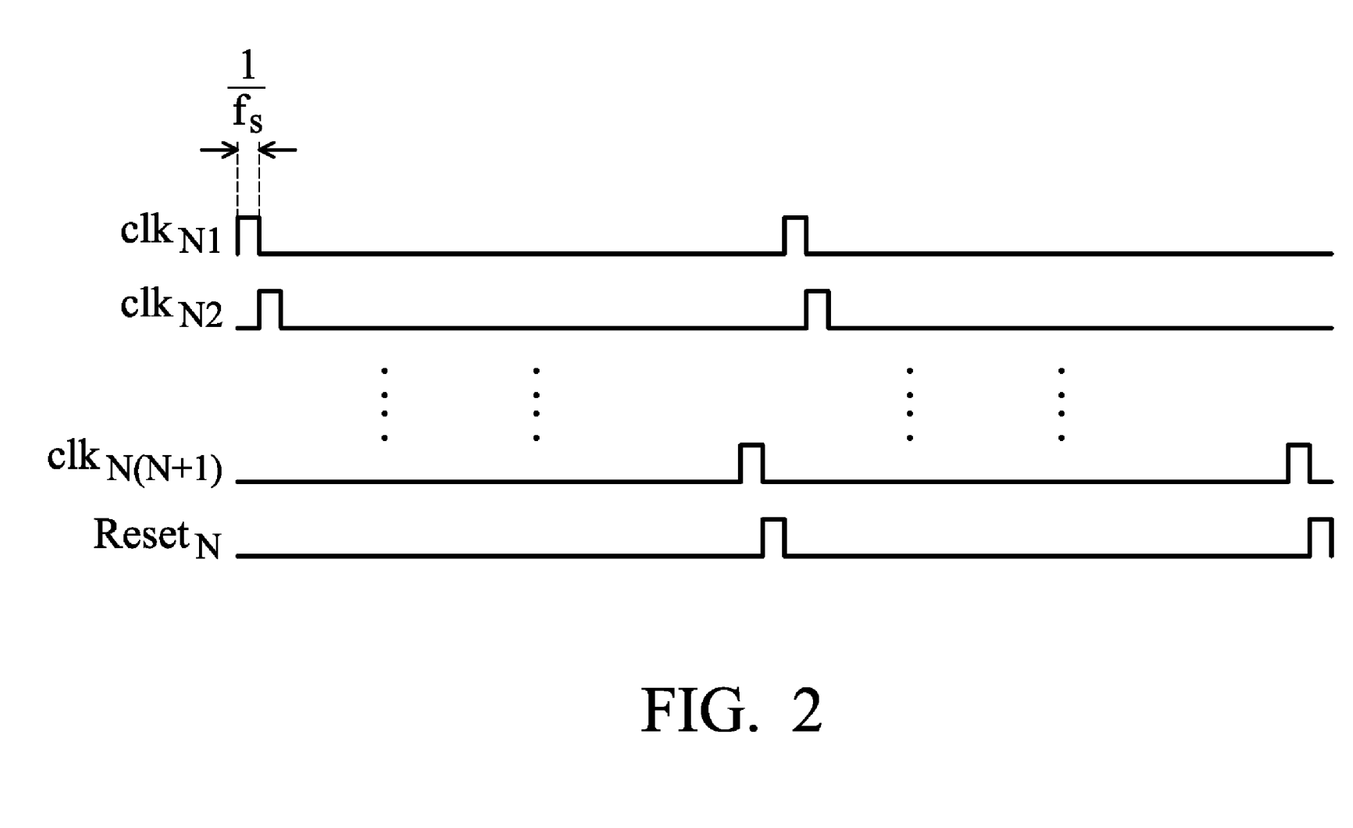
FIG. 2 depicts an exemplary embodiment of the clock signals $clk_{N1}$~$clk_{N(N+1)}$ and the $Reset_N$.

The first and second switched-capacitor networks 102 and 104 are each controlled by a set of clock signals. The first switched-capacitor network 102 is controlled by clock signals $clk_{N1}$~$clk_{N(N+1)}$ and the $Reset_N$. The second switched-capacitor network 104 is controlled by clock signals $clk_{P1}$~$clk_{P(P+1)}$ and the $Reset_P$. FIG. 2 depicts an exemplary embodiment of the clock signals $clk_{N1}$~$clk_{N(N+1)}$ and the $Reset_N$. The pulse width of the clock signals $clk_{N1}$~$clk_{N(N+1)}$ may be dependent on a sampling frequency $f_s$. In this case, the clock signal $clk_{N2}$ lags the clock signal $clk_{N1}$ by one sampling period $1/f_s$, the clock signal $clk_{N3}$ lags the clock signal $clk_{N2}$ by one sampling period $1/f_s$ thus, on. Furthermore, the clock signal $Reset_N$ lags the clock signal $clk_{N(N+1)}$ by one sampling period $1/f_s$. Similarly, the clock signals $clk_{P1}$~$clk_{P(P+1)}$ and the $Reset_P$ may be generated in the same manner.

The first switched-capacitor network 102 comprises a plurality of capacitors $C_{N1}$~$C_{NN}$, a plurality of charging switches $M_{NS1}$~$M_{NSN}$, a plurality of discharging switches $M_{NR1}$~$M_{NRN}$ and a plurality of charge-summing switches $M_{NSS1}$~$M_{NSSN}$. The first set of clock signals $clk_{N1}$~$clk_{N(N+1)}$ and the $Reset_N$ control the switches $M_{NS1}$~$M_{NSN}$, $M_{NR1}$~$M_{NRN}$ and $M_{NSS1}$~$M_{NSSN}$. According to the clock signals $clk_{N1}$~$clk_{NN}$, the charging switches $M_{NS1}$~$M_{NSN}$ are alternatively turned on to alternatively couple the capacitors $C_{N1}$~$C_{NN}$ to the first input terminal $In_-$. According to the clock signal $clk_{N(N+1)}$, the charge-summing switches $M_{NSS1}$~$M_{NSSN}$ are turned on to couple the capacitors $C_{N1}$~$C_{NN}$ with the output capacitor $C_o$, thus, the charges in the capacitors $C_{N1}$~$C_{NN}$ and $C_o$ are rearranged. According to the clock signal $Reset_N$, the discharging switches $M_{NR1}$~$M_{NRN}$ are turned on to discharge the capacitors $C_{N1}$~$C_{NN}$. The capacitor discharging controlled by the discharging switches $M_{NR1}$~$M_{NRN}$ can dramatically improve noise filtering. The discharging switches $M_{NR1}$~$M_{NRN}$ are optional.

The second switched-capacitor network 104 comprises a plurality of capacitors $C_{P1}$~$C_{PP}$, a plurality of charging switches $M_{PS1}$~$M_{PSP}$, a plurality of discharging switches $M_{PR1}$~$M_{PRP}$ and a plurality of charge-summing switches $M_{PSS1}$~$M_{PSSP}$. The second set of clock signals $clk_{P1}$~$clk_{P(P+1)}$ and the $Reset_P$ control the switches $M_{PS1}$~$M_{PSP}$, $M_{PR1}$~$M_{PRP}$ and $M_{PSS1}$~$M_{PSSP}$. According to the clock signals $clk_{P1}$~$clk_{PP}$, the charging switches $M_{PS1}$~$M_{PSP}$ are alternatively turned on to couple the capacitors $C_{P1}$~$C_{PP}$ to the second input terminal $In_+$. According to the clock signal $clk_{P(P+1)}$, the charge-summing switches $M_{PSS1}$~$M_{PSSP}$ are turned on to couple the capacitors $C_{P1}$~$C_{PP}$ with the output capacitor $C_o$, thus, the charges in the capacitors $C_{P1}$~$C_{PP}$ and $C_o$ are rearranged. According to the $Reset_P$, the discharging switches $M_{PR1}$~$M_{PRP}$ are turned on to discharge the capacitors $C_{P1}$~$C_{PP}$. The capacitor discharging controlled by the discharging switches $M_{PR1}$~$M_{PRP}$ can dramatically improve noise filtering. The discharging switches $M_{PR1}$~$M_{PRP}$ are optional.

The first input signal $In_-$ may include a common-mode portion $X_{com}$ and a negative differential portion $-X_{diff}$. For example, $In_- = X_{com} - X_{diff}$ .... The second input signal $In_+$ may include the common-mode portion $X_{com}$ and a positive differential portion $+X_{diff}$. For example, $In_+ = X_{com} + X_{diff}$ .... The down conversion filter 100 provides the common-mode and differential portions $X_{com}$ and $X_{diff}$ with distinct frequency responses. The details of the frequency responses are illustrated as follows:

$$H_{HR,diff}(z_1, z_2) = \frac{\left(\sum_{i=1}^{P} Cp_{P+1-i} z_1^{-(i-1)}\right)}{\left(1 - \frac{Co z_1^{-(P+1)}}{Co + \sum_{i=1}^{P} Cp_i}\right)\left(Co + \sum_{i=1}^{P} Cp_i\right)} - \frac{\left(\sum_{i=1}^{N} Cn_{N+1-i} z_2^{-(i-1)}\right)}{\left(1 - \frac{Co z_2^{-(N+1)}}{Co + \sum_{i=1}^{N} Cn_i}\right)\left(Co + \sum_{i=1}^{N} Cn_i\right)}, \text{ and}$$

$$H_{HR,com}(z_1, z_2) = \frac{\left(\sum_{i=1}^{P} Cp_{P+1-i} z_1^{-(i-1)}\right)}{\left(1 - \frac{Co z_1^{-(P+1)}}{Co + \sum_{i=1}^{P} Cp_i}\right)\left(Co + \sum_{i=1}^{P} Cp_i\right)} + \frac{\left(\sum_{i=1}^{N} Cn_{N+1-i} z_2^{-(i-1)}\right)}{\left(1 - \frac{Co z_2^{-(N+1)}}{Co + \sum_{i=1}^{N} Cn_i}\right)\left(Co + \sum_{i=1}^{N} Cn_i\right)}.$$

$H_{IIR,diff}(z_1, z_2)$ represents frequency response for the differential portion $X_{diff}$. $H_{IIR,com}(z_1, z_2)$ represents frequency response for the common-mode portion $X_{com}$. By properly designing the value of the capacitors $C_{N1}$~$C_{NN}$, $C_{P1}$~$C_{PP}$ and $C_o$, distinct frequency responses for the common-mode portion $X_{com}$ and the differential portion $X_{diff}$ are available.

Figure 3:
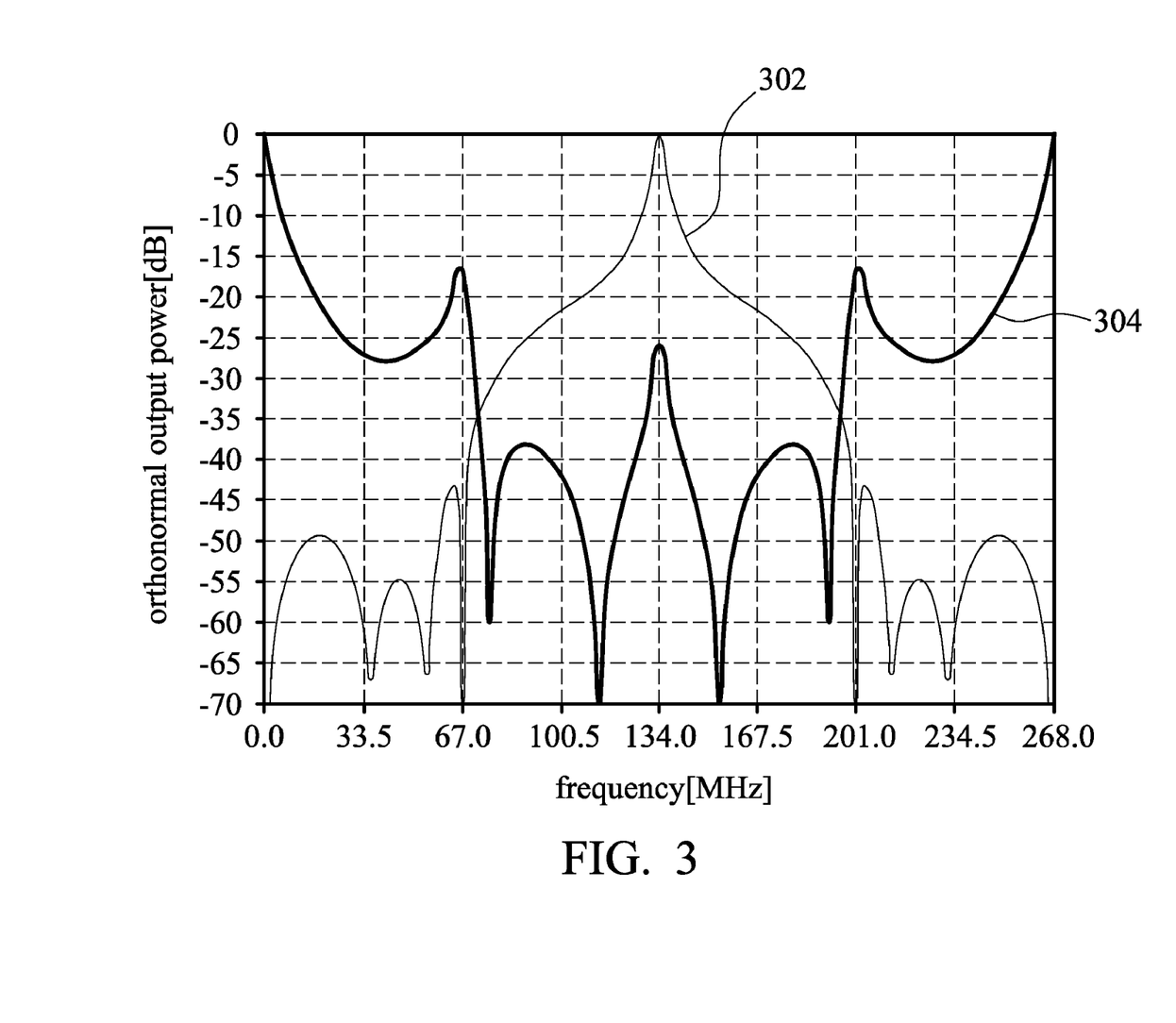
FIG. 3 depicts the exemplary embodiment of frequency responses $H_{IIR,diff}(z1, z2)$ and $H_{IIR,com}(z1, z2)$.

FIG. 3 depicts the exemplary embodiments of the frequency responses. Waveform 302 shows the frequency response $H_{IIR,diff}(z_1, z_2)$ that is for the differential portion $X_{diff}$. Waveform 304 shows the frequency response $H_{IIR,com}(z_1, z_2)$ that is for the common-mode portion $X_{com}$. In a specific band (such as the pass band), the down conversion filter 100 passes the differential portion $X_{diff}$ and depresses the common-mode portion $X_{com}$. Thus, the down conversion filter 100 has good common-mode noise filtering in the pass band.

The two sets of clock signals controlling the first and second switched-capacitor networks have several designs. However, the two sets of clock signals are not limited to having the same frequency; they may comply with distinct frequencies in other cases.

The clock signals $clk_{N(N+1)}$ and $clk_{P(P+1)}$ may be the same signal or distinct signals. When the clock signal $clk_{N(N+1)}$ equals to the clock signal $clk_{P(P+1)}$, the capacitors $C_{N1}$~$C_{NN}$ and $C_{P1}$~$C_{PP}$ are simultaneously coupled to the output terminal OUT.

Figure 4:
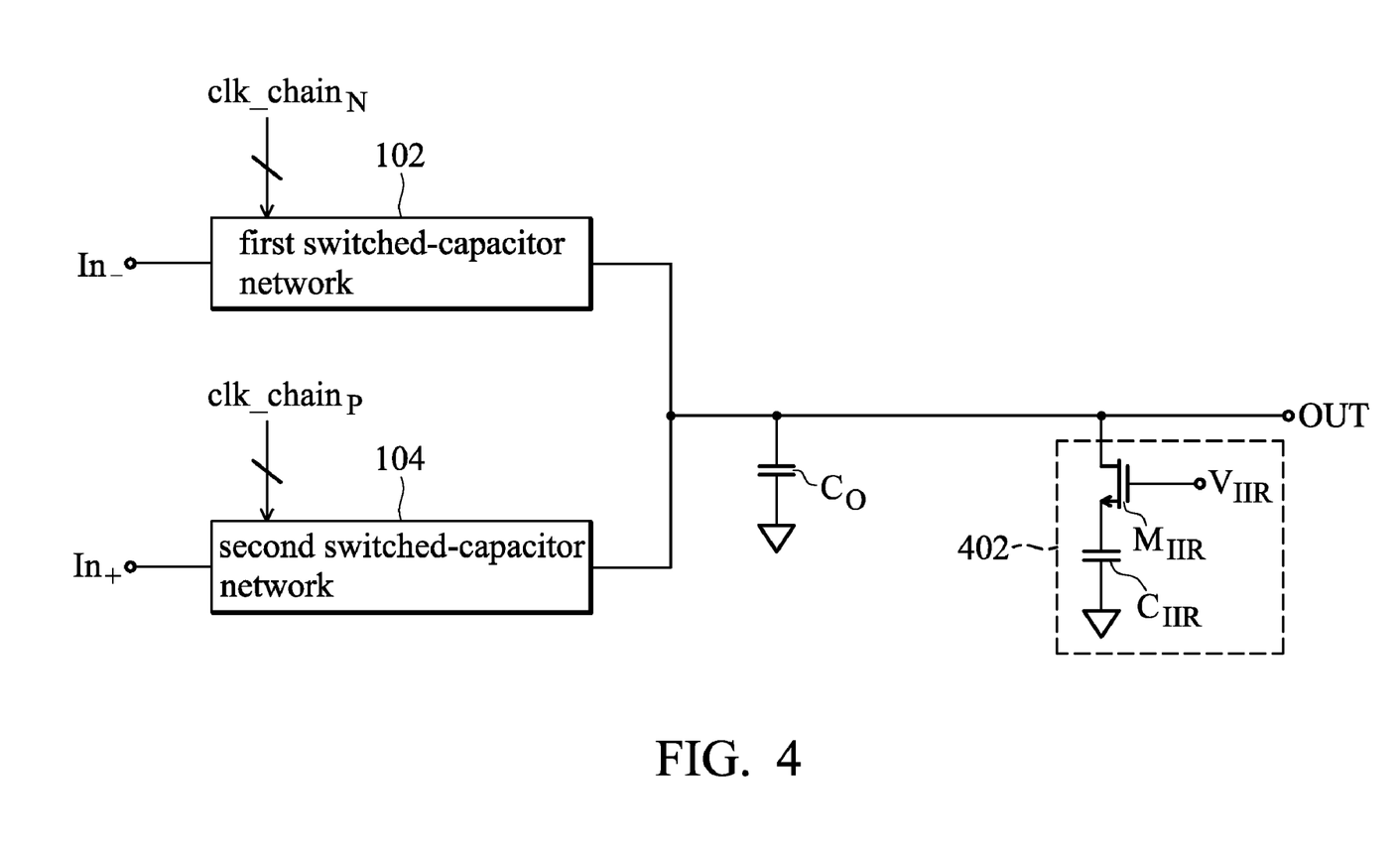
FIG. 4 depicts a down conversion filter with controllable bandwidth.

The exemplary embodiment of the FIG. 1 does not introduce output capacitor $C_o$ resetting. FIG. 1 is an infinite impulse response filter, as known as IIR filter. The bandwidth thereof is limited. The invention further discloses down conversion filters with controllable bandwidth, as shown in FIG. 4. Symbol $clk\_chain_N$ represent clock signals $clk_{N1}$~$clk_{N(N+1)}$ and the $Reset_N$ controlling the first switched-capacitor network 102. Symbol $clk\_chain_P$ represent clock signals $clk_{P1}$~$clk_{P(P+1)}$ and the $Reset_P$ controlling the second switched-capacitor network 104. Compared with FIG. 1, the down conversion filter of FIG. 4 further comprises a variable capacitor 402 coupled to the output terminal OUT. The variable capacitor 402 may be coupled in parallel or in series with the output capacitor $C_o$ to change the capacitance at the output terminal OUT. The capacitance of the variable capacitor 402 is dependent on the voltage value $V_{IIR}$. In other embodiments, the variable capacitor 402 may be replaced by any other variable capacitors well known by a person skilled in the art.

Figure 5A:
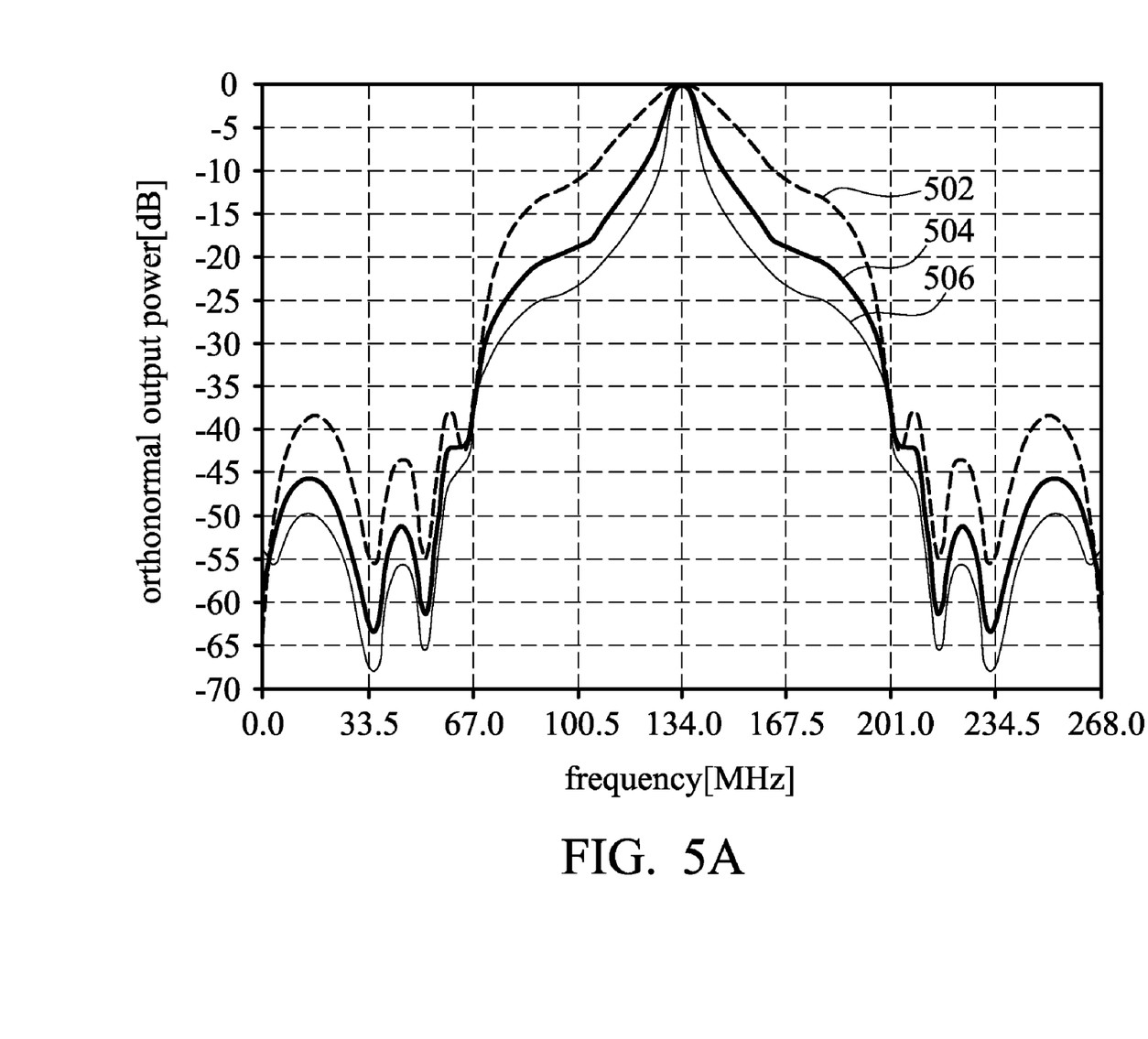
FIGS. 5A and 5B show frequency responses of the down conversion filter of FIG. 4, wherein the variable capacitor 402 is set to several capacitances.
Figure 5B:
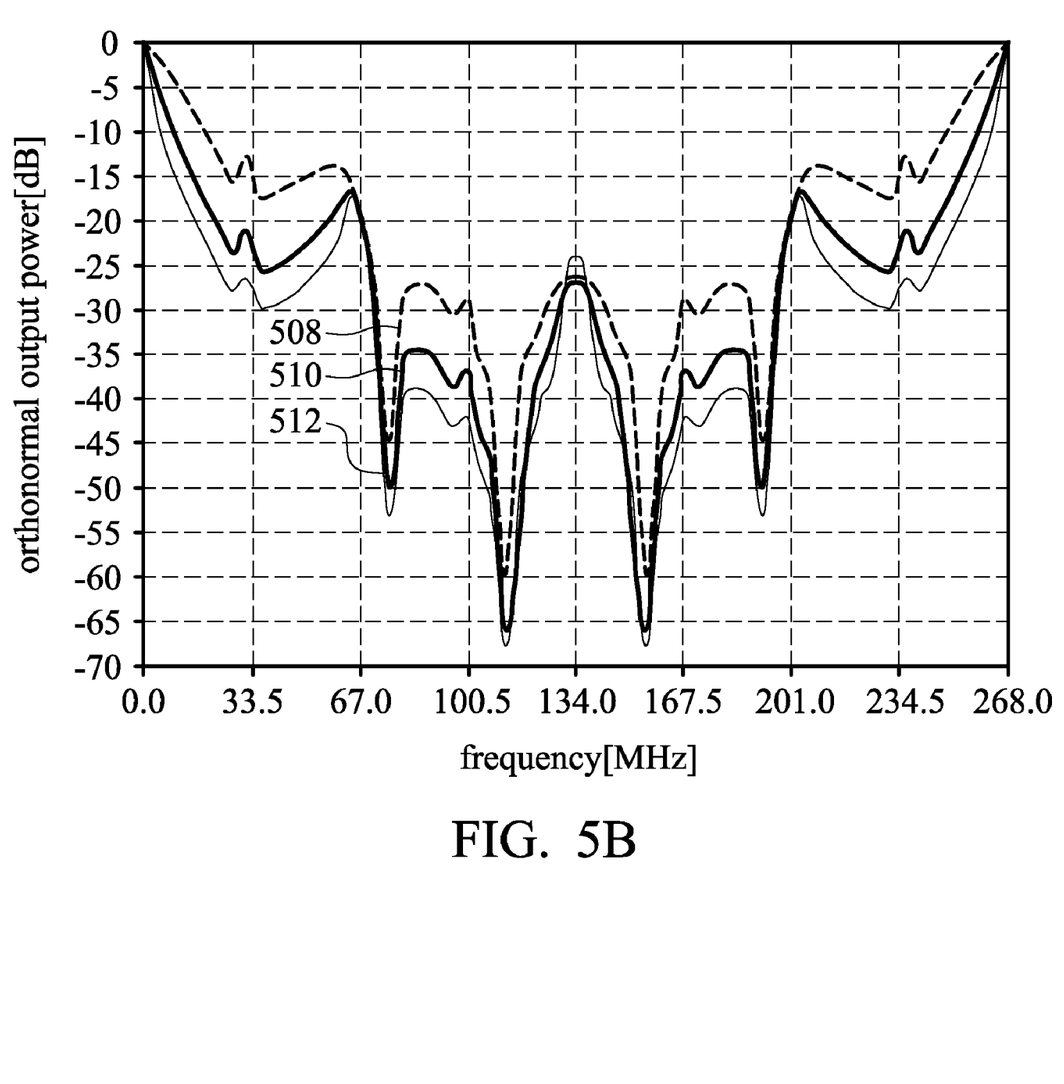

FIGS. 5A and 5B show frequency responses of the down conversion filter of FIG. 4, wherein the variable capacitor 402 is set to several capacitances. FIG. 5A depicts the frequency responses $H_{IIR,diff}(z_1, z_2)$ for the differential portion $X_{diff}$. The increasing capacitance of the variable capacitor 402 results in the frequency responses 502, 504 and 506. FIG. 5B depicts the frequency responses $H_{IIR,com}(z_1, z_2)$ for the common-mode portion $X_{com}$. The increasing capacitance of the variable capacitor 402 results in the frequency responses 508, 510 and 512.

Figure 6A:
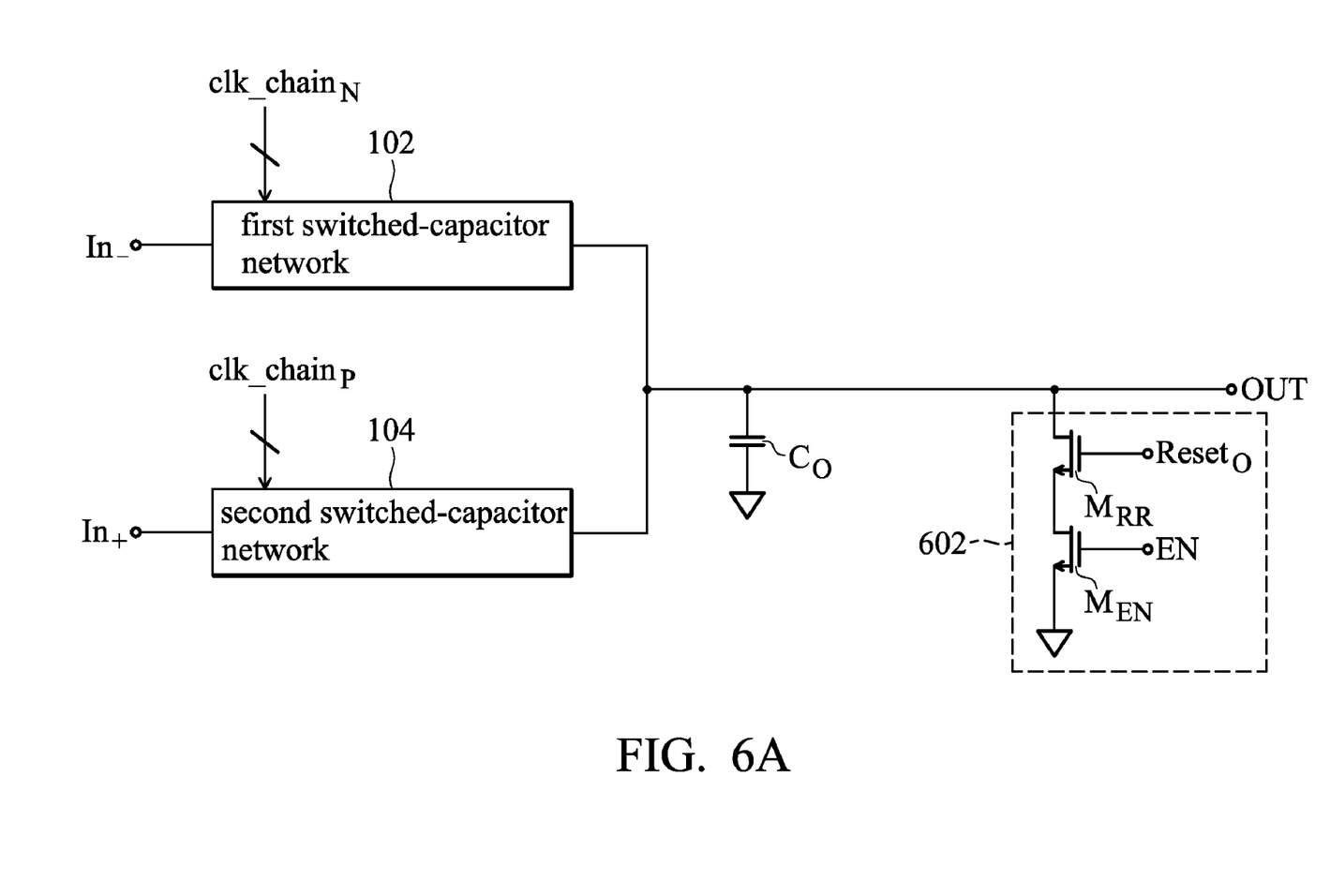
FIG. 6A shows an exemplary embodiment of FIR filters.
Figure 6B:
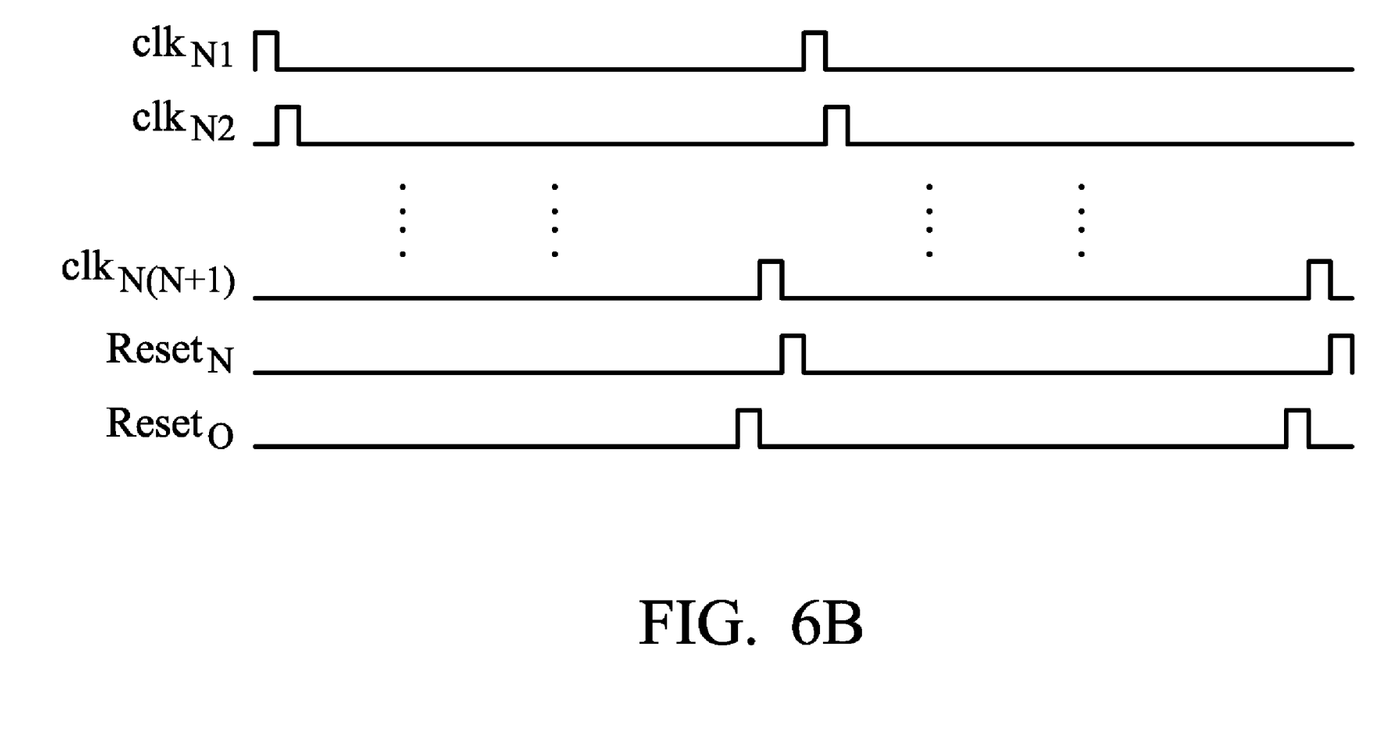
FIG. 6B shows exemplary embodiments of the clock signals for FIG. 6A.

The invention further discloses down conversion filters with finite impulse response (FIR). FIG. 6A shows one of the FIR filters. Compared with FIG. 1, the down conversion filter of FIG. 6A further comprises a discharging circuit 602. The discharging circuit 602 is enabled by a signal EN. When the signal EN is high, the clock signal Reset$_o$ controls the discharging of the output capacitor $C_o$. FIG. 6B shows an exemplary embodiment of the clock signal Reset$_o$. The enabling of the clock signal Reset$_o$ (discharging of the output capacitor $C_o$) is prior to the connection between the switched-capacitor networks 102 and 104 and the output terminal OUT (for example, prior to the duty period of clock $clk_{N(N+1)}$). The frequency responses for the common-mode portion $X_{com}$ and differential portion $X_{diff}$ of the signals $In_-$ and $In_+$ are illustrated as follows:

$$H_{FIR,diff}(z_1, z_2) = \frac{\left(\sum_{i=1}^{P} Cp_{P+1-i} z_1^{-(i-1)}\right)}{\left(Co + \sum_{i=1}^{P} Cp_i\right)} - \frac{\left(\sum_{i=1}^{N} Cn_{N+1-i} z_2^{-(i-1)}\right)}{\left(Co + \sum_{i=1}^{N} Cn_i\right)}, \text{ and}$$

$$H_{FIR,com}(z_1, z_2) = \frac{\left(\sum_{i=1}^{P} Cp_{P+1-i} z_1^{-(i-1)}\right)}{\left(Co + \sum_{i=1}^{P} Cp_i\right)} + \frac{\left(\sum_{i=1}^{N} Cn_{N+1-i} z_2^{-(i-1)}\right)}{\left(Co + \sum_{i=1}^{N} Cn_i\right)}$$

$H_{FIR,diff(z1,z2)}$ represents frequency response for the differential portion $X_{diff}$. $H_{FIR, com}(z1,z2)$ represents frequency response for the common-mode portion $X_{com}$.

Figure 7:
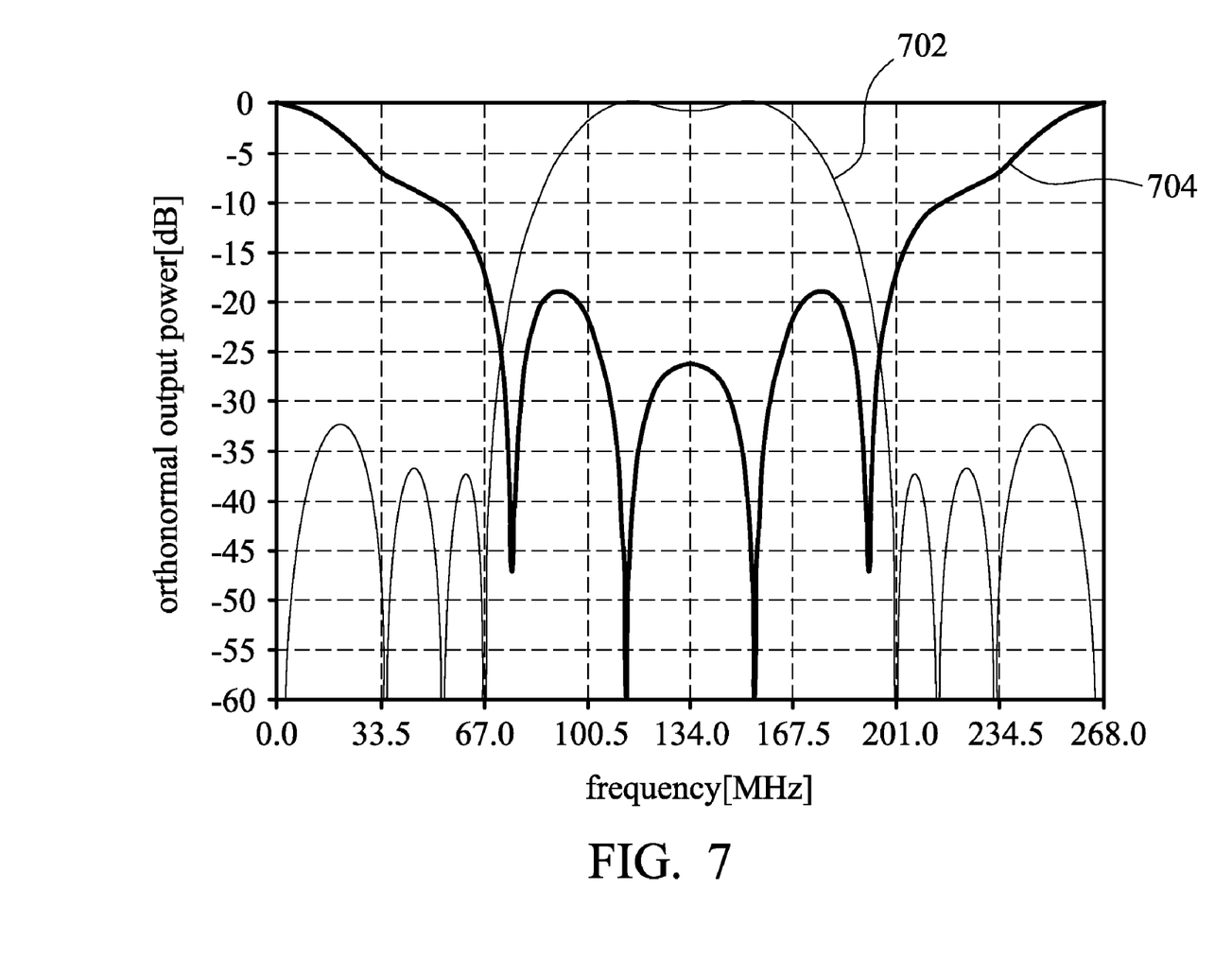
FIG. 7 shows frequency responses of an FIR filter by waveforms.

FIG. 7 shows frequency responses of an FIR filter by waveforms. Waveform 702 shows the frequency response $H_{FIR,diff}(z1,z2)$ that is for the differential portion $X_{diff}$. Waveform 704 shows the frequency response $H_{FIR, com}(z1,z2)$ that is for the common-mode portion $X_{com}$.

Figure 8:
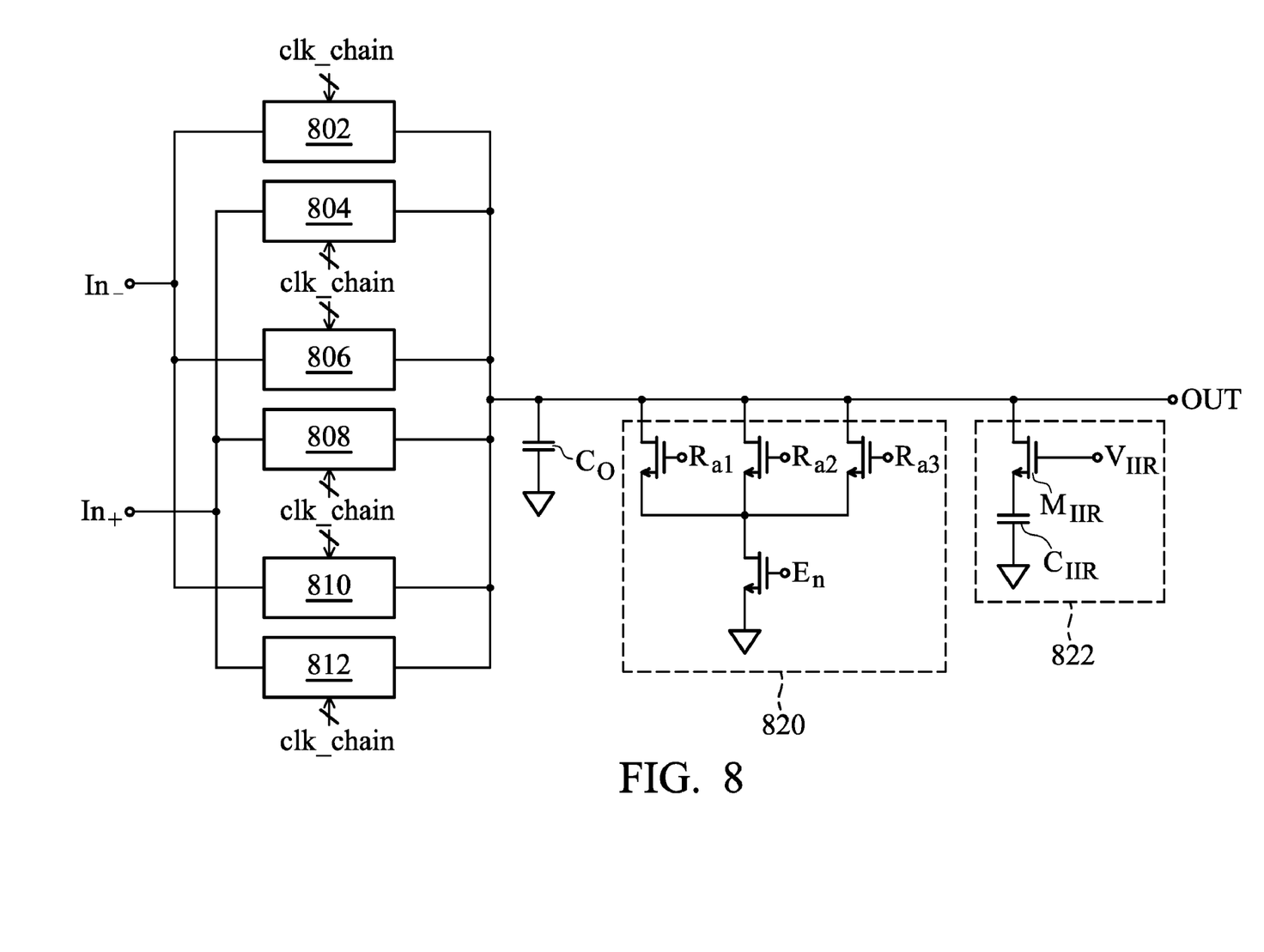
FIG. 8 shows a down conversion filter with more than two switched-capacitor networks.

The invention further discloses down conversion filters with more than two switched-capacitor networks, as shown in FIG. 8. Signals In_ and In_+ are differential signals from a preceding circuit. Switched-capacitor networks 802 and 804 form the first unit. Switched-capacitor networks 806 and 808 form the second unit. Switched-capacitor networks 810 and 812 form the third unit. A set of clock signals clk_chain are sent to the switched-capacitor networks as control signals. However, different units may have different use on the clock signals clock_chain. For example, different units may connect their switched-capacitor networks to the output terminal OUT according to different clock signals. Thus, different units may be coupled to the output terminal OUT asynchronously. By this technique shown in FIG. 8, a large number of the switched-capacitor networks may be supported without reducing the tap length of the down conversion filter. Thus, flexibility of the down conversion filter is dramatically improved. It should be noted that the switched-capacitor networks shown in FIG. 8 are not all limited to the use the set of clock signals clk_chain. Different clock signal sets may be used in controlling different switched-capacitor networks.

Figure 9:
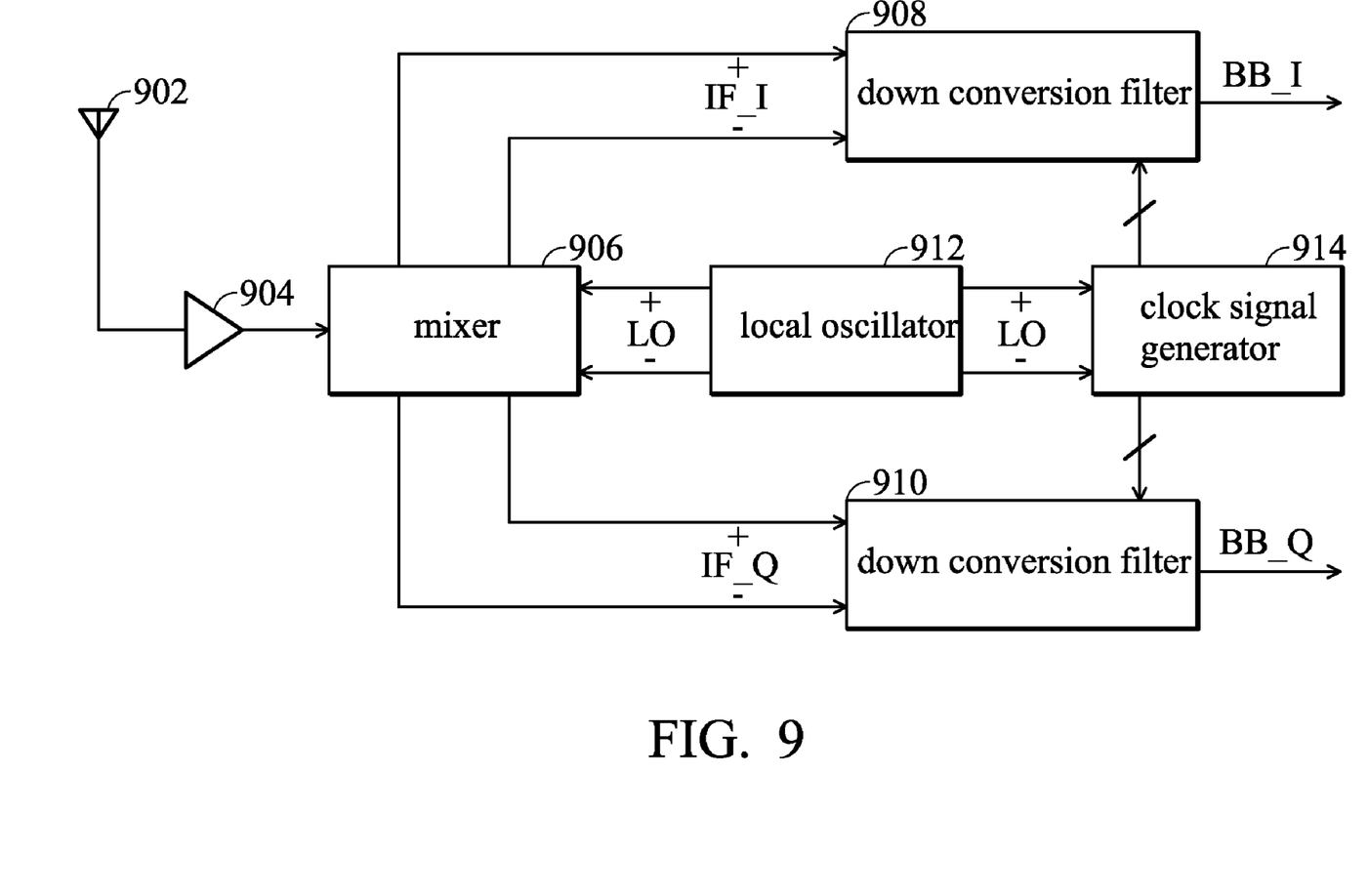
FIG. 9 depicts an exemplary embodiment of communication receivers of the invention.

The invention further discloses a communication receiver, as shown in FIG. 9. An antenna 902 receives signals. The received signal is sent to a mixer 906, via a low-noise transconductance amplifier (LNTA) 904, to be down converted to an intermediate frequency. The mixer 906 differentially outputs an in-phase signal IF_I by a first output terminal and a second output terminal, and differentially outputs an orthogonal signal IF_Q by a third output terminal and a fourth output terminal. The down conversion filters 908 and 910 may be realized by any of the aforementioned down-conversion filters. The down conversion filter 908 converts the in-phase signal IF_I to a base-band in-phase signal BB_I. The down conversion filter 910 converts the orthogonal signal IF_Q to a base-band orthogonal signal BB_Q. The down conversion filters 908 and 910 efficiently eliminate the pass band common-mode signals of IF_I and IF_Q. The control signals of the down conversion filters 908 and 910 are generated by a clock signal generator 914. The local oscillator 912 outputs local oscillating signals LO for the clock signal generator 914 and the mixer 906.

In another exemplary embodiment of the communication receivers of the invention, the mixer 906 does not separate the phase of the intermediate frequency signal. The mixer 906 outputs the same signal IF to both down conversion filters 908 and 910. With properly designed capacitors in the down conversion filters 908 and 910, a base-band in-phase signal BB_I is outputted by the down conversion filter 908 and a base-band orthogonal signal BB_Q is outputted by the down conversion filter 910.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A down conversion filter, comprising:
a first input terminal, receiving a first input signal;
a second input terminal, receiving a second input signal;
an output terminal;
an output capacitor, coupled to the output terminal;
a first switched-capacitor network, comprising a plurality of first capacitors, a plurality of first charging switches and a plurality of first charge-summing switches, wherein the first charging switches are designed to alternatively couple the first capacitors to the first input terminal, and the first charge-summing switches are designed to couple the first capacitors to the output terminal; and
a second switched capacitor network, comprising a plurality of second capacitors, a plurality of second charging switches and a plurality of second charge-summing switches, wherein the second charging switches are designed to alternatively couple the second capacitors to the second input terminal, and the second charge-summing switches are designed to couple the second capacitors to the output terminal and are switched on at the exact same time as the first charge-summing switches, wherein:
the first and second input signals are a pair of differential signals from a preceding circuit; and
the first capacitors and the second capacitors are directly connected to the output capacitor when the first charge-summing switches and the second charge-summing switched are turned on.

2. The down conversion filter as claimed in claim 1, further comprising a plurality of first discharging switches, designed to discharge the first capacitors.

3. The down conversion filter as claimed in claim 1, further comprising a plurality of second discharging switches, designed to discharge the second capacitors.

4. The down conversion filter as claimed in claim 1, wherein the first input signal includes a common-mode portion and a negative differential portion, and the second input signal includes the common-mode portion and a positive differential portion.

5. The down conversion filter as claimed in claim 1, further comprising a variable capacitor coupled to the output terminal.

6. The down conversion filter as claimed in claim 1, further comprising a discharging circuit coupled to the output terminal, designed to discharge the output capacitor according to a clock signal for output capacitor discharging.

7. A communication receiver, comprising:
a mixer, down-converting a received signal, outputting a pair of differential signals at a first and a second output terminal to form an in-phase signal, and outputting another pair of differential signals at by a third and a fourth output terminal to form an orthogonal signal;
a first down conversion filter, comprising:
an output terminal for a base band in-phase signal;
a first output capacitor, coupled to the output terminal for the base band in-phase signal;
a first switched-capacitor network, comprising a plurality of first capacitors, a plurality of first charging switches and a plurality of first charge-summing switches, wherein the first charging switches are designed to alternatively couple the first capacitors to the first output terminal of the mixer, and the first charge-summing switches are designed to couple the first capacitors to the output terminal for the base band in-phase signal; and a second switched-capacitor network, comprising a plurality of second capacitors, a plurality of second charging switches and a plurality of second charge-summing switches, wherein the second charging switches are designed to alternatively couple the second capacitors to the second output terminal of the mixer, and the second charge-summing switches are designed to couple the second capacitors to the output terminal for the base band in-phase signal and are switched on at the exact same time as the first charge-summing switches, wherein the first capacitors and the second capacitors are directly connected to the first output capacitor when the first charge-summing switches and the second charge-summing switches are turned on; and a second down conversion filter, comprising:
an output terminal for a base band orthogonal signal;
a second output capacitor, coupled to the output terminal for the base band orthogonal signal;
a third switched-capacitor network, comprising a plurality of third capacitors, a plurality of third charging switches and a plurality of third charge-summing switches, wherein the third charging switches are designed to alternatively couple the third capacitors to the third output terminal of the mixer, and the third charge-summing switches are designed to couple the third capacitors to the output terminal for the base band orthogonal signal; and
a fourth switched-capacitor network, comprising a plurality of fourth capacitors, a plurality of fourth charging switches and a plurality of fourth charge-summing switches, wherein the fourth charging switches are designed to alternatively couple the fourth capacitors to the fourth output terminal of the mixer, and the fourth charge-summing switches are designed to couple the fourth capacitors to the output terminal for the base band orthogonal signal and are switched on at the exact same time as the third charge-summing switches,
wherein the third capacitors and the fourth capacitors are directly connected to the second output capacitor when the third charge-summing switches and the fourth charge-summing switches are turned on.

8. The communication receiver as claimed in claim 7, further comprising a plurality of first discharging switches for discharging the first capacitors.

9. The communication receiver as claimed in claim 7, further comprising a plurality of second discharging switches for discharging the second capacitors.

10. The communication receiver as claimed in claim 7, further comprising a plurality of third discharging switches for discharging the third capacitors.

11. The communication receiver as claimed in claim 7, further comprising a plurality of fourth discharging switches for discharging the fourth capacitors.

12. A communication receiver, comprising:
a mixer, down-converting a received signal and outputting a pair of differential signals at a first and a second output terminal to form and intermediate frequency signal;
a first down conversion filter, comprising:
an output terminal for a base band in-phase signal;
a first output capacitor, coupled to the output terminal for the base band in-phase signal;
a first switched-capacitor network, comprising a plurality of first capacitors, a plurality of first charging switches and a plurality of first charge-summing switches, wherein the first charging switches are designed to alternatively couple the first capacitors to the first output terminal of the mixer, and the first charge-summing switches are designed to couple the first capacitors to the output terminal for the base band in-phase signal; and
a second switched-capacitor network, comprising a plurality of second capacitors, a plurality of second charging switches and a plurality of second charge-summing switches, wherein the second charging switches are designed to alternatively couple the second capacitors to the second output terminal of the mixer, and the second charge-summing switches are designed to couple the second capacitors to the output terminal for the base band in-phase signal and are switched on at the exact same time as the first charge-summing switches,
wherein the first capacitors and the second capacitors are directly connected to the first output capacitor when the first charge-summing switches and the second charge-summing switches are turned on and
a second down conversion filter, comprising:
an output terminal for a base band orthogonal signal;
a second output capacitor, coupled to the output terminal for the base band orthogonal signal;
a third switched-capacitor filter, comprising a plurality of third capacitors, a plurality of third charging switches and a plurality of third charge-summing switches, wherein the third charging switches are designed to alternatively couple the third capacitors to the first output terminal of the mixer, and the third charge-summing switches are designed to coupled the third capacitors to the output terminal for the base band orthogonal signal; and
a fourth switched-capacitor network, comprising a plurality of fourth capacitors, a plurality of fourth charging switches and a plurality of fourth charge-summing switches, wherein the fourth charging switches are designed to alternatively couple the fourth capacitors to the second output terminal of the mixer, and the fourth charge-summing switches are designed to couple the fourth capacitors to the output terminal for the base band orthogonal signal and are switched on at the exact same time as the third charge-summing switches,
wherein the third capacitors and the fourth capacitors are directly connected to the second output capacitor when the third charge-summing switches and the fourth charge-summing switches are turned on.

13. The communication receiver as claimed in claim 12, further comprising a plurality of first discharging switches for discharging the first capacitors.

14. The communication receiver as claimed in claim 12, further comprising a plurality of second discharging switches for discharging the second capacitors.

15. The communication receiver as claimed in claim 12, further comprising a plurality of third discharging switches for discharging the third capacitors.

16. The communication receiver as claimed in claim 12, further comprising a plurality of fourth discharging switches for discharging the fourth capacitors.

* * * * *